United States Patent [19]

Powell

[11] Patent Number: 5,030,827

[45] Date of Patent: Jul. 9, 1991

[54] RADIATION DETECTION ARRANGEMENTS

[75] Inventor: Brian D. Powell, Maidenhead, England

[73] Assignee: Kidde-Graviner Limited, Derby, England

[21] Appl. No.: 89,224

[22] Filed: Aug. 25, 1987

[30] Foreign Application Priority Data

Sep. 9, 1986 [GB] United Kingdom ............... 8621688

[51] Int. Cl.⁵ ............................................. G01J 5/12
[52] U.S. Cl. .............................. 250/338.1; 250/338.3; 250/349
[58] Field of Search ........... 250/338 PY, 338.1, 338.3, 250/349

[56] References Cited

U.S. PATENT DOCUMENTS

| | | | |
|---|---|---|---|
| 3,769,096 | 10/1973 | Ashkin et al. | 250/338 |
| 4,166,390 | 9/1979 | Benzinger | 250/352 |
| 4,258,260 | 3/1981 | Obara et al. | 250/338 PY |
| 4,284,888 | 8/1981 | Appleby | 250/338 PY |
| 4,379,290 | 4/1983 | Muggli et al. | 250/381 |
| 4,475,040 | 10/1984 | Matsumoto et al. | 250/338 PY |
| 4,485,305 | 11/1984 | Kuwano et al. | 250/338 R |
| 4,542,294 | 9/1985 | Tamura et al. | 250/338 PY |
| 4,556,796 | 12/1985 | Renals | 250/338 PY |
| 4,558,342 | 10/1985 | Sclar | 250/338 |

FOREIGN PATENT DOCUMENTS

| | | |
|---|---|---|
| 2135101 | 9/1972 | Fed. Rep. of Germany. |
| 55-121124 | 12/1980 | Japan. |
| 2173038 | 10/1986 | United Kingdom. |
| 2173947 | 10/1986 | United Kingdom. |

Primary Examiner—Edward P. Westin
Attorney, Agent, or Firm—Leydig, Voit & Mayer

[57] ABSTRACT

A radiation detection arrangement is described using a layer of pyroelectric material such as polyvinylidene fluoride positioned between two electrodes. One electrode has a radiation-reflecting front surface and is coated with material having selected radiation absorbing characteristics. This material absorbs radiation lying within a predetermined wavelength band and this therefore heats the material and produces an electrical output. Radiation lying outside the absorption band of material is unabsorbed and is reflected by the reflecting surface. No heating takes place and no corresponding electrical output is produced. A radiation-selective detector is therefore produced without the need for optical filters.

27 Claims, 2 Drawing Sheets

RADIATION DETECTION ARRANGEMENTS

BACKGROUND OF THE INVENTION

The invention relates to a radiation detection arrangement, comprising a thermoelectrically responsive substrate.

Various forms of such arrangements are known, such as comprising thermoelectrically responsive material in the form of pyroelectric or thermopile material. In many applications, it is desired to vary the response of the material to radiation. For example, this may be achieved by placing one or more filters in front of the substrate, the filter or filters being selected so as to transmit radiation only in one or more specific radiation bands. However, filters are expensive and can be bulky and many restrict the field of view of the radiation detection arrangement. The invention aims to overcome these problems.

BRIEF DESCRIPTION OF THE INVENTION

Accordingly the invention is characterized by a radiation-reflecting surface on the substrate at least a first part of which is covered by material whose radiation absorbing capability has a predetermined variation.

In a more specific sense, the invention provides a radiation detection arrangement, comprising a layer of pyroelectric material at least part of which is positioned between a first pair of electrodes, and which is characterized in that one of the electrodes has a radiation-reflecting surface at least a first part of which is covered with radiation absorbing material having a greater radiation absorbing capability at one predetermined wavelength than at others, whereby incident radiation at the said one wavelength is absorbed and heats the adjacent pyroelectric material to produce a corresponding electrical output between the electrodes and incident radiation at the other wavelengths is substantially unabsorbed and is reflected by the reflecting surface and thereby produces substantially no heating.

DESCRIPTION OF THE DRAWINGS

Electromagnetic radiation detectors embodying the invention will now be described, by way of example only, with reference to the accompanying diagrammatic drawings in which.

DESCRIPTION OF PREFERRED EMBODIMENTS

Figure 1:
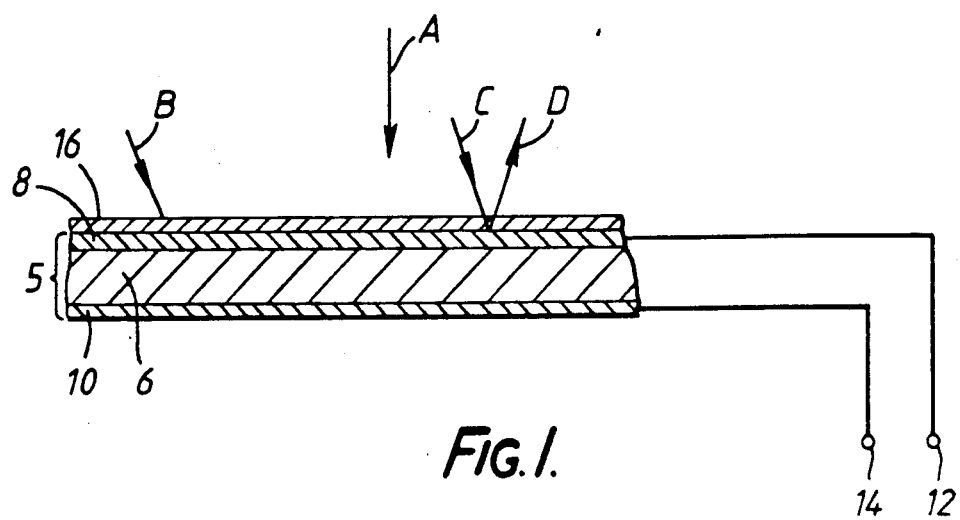
FIG. 1 is a cross-section through one of the detectors.

The detector arrangement of FIG. 1 comprises a thermoelectric detector 5, that is, a detector which produces an electrical output in response to heat. The thermoelectric detector 5 may take any suitable form. Advantageously, however, it is a pyroelectric detector. It may, for example, be a ceramic pyroelectric detector. Preferably, however, it is a pyroelectric detector based on a pyroelectric polymer material such as polyvinylidene fluoride (PVdF). In such a case, it comprises a layer of PVdF 6 having electrically conductive electrode surfaces or coatings 8 and 10 on its front and rear surfaces respectively. When heated by radiation A arriving at its front surface in the direction of the arrow, the resultant change in temperature of the material 6 causes an electrical potential to be developed between the electrodes 8 and 10 and thus between terminals 12 and 14.

Pyroelectric detectors based on PVdF and similar polymer materials are advantageous because they can be made with a relatively large sensitive area (the area receiving the radiation A); areas of the order of several square centimeters are possible.

In accordance with a feature of the invention, the front surface of the detector 5 is covered with a coating or covering 16 whose radiation absorbing characteristics are specially selected in a manner now to be described.

In one example the coating 16 is arranged to absorb radiation lying within a predetermined narrow wavelength band, in the infra-red region for example, but to transmit radiation (with little or no absorption) at other wavelengths. In addition, the front surface of the electrode 8 is made to be reflective of radiation. The result is to make the arrangement sensitive only to radiation lying within the predetermined wavelength band.

Thus, the arrow B shows radiation striking the detector arrangement and lying within the predetermined narrow wavelength band. This radiation is therefore more or less completely absorbed by the coating 16 which thus becomes heated. This heat is transmitted by thermal conduction to the pyroelectric material 6 and causes its temperature to change, as a result of which a corresponding electrical output is produced between terminals 12 and 14.

In contrast, the arrow C shows radiation striking the detector arrangement and lying outside the predetermined narrow wavelength band. The radiation C is therefore not absorbed to any significant extent by the coating 16 and passes through the coating, strikes the reflective electrode 8 and is reflected back again as shown by arrow D. Because substantially no absorption takes place in the coating 16, and because of the reflection, there is substantially no heating of the detector 5 and therefore no electrical output is produced.

In this way, therefore, a radiation detector arrangement can be produced which, by suitable selection of the coating 16, can be rendered responsive to radiation at a particular wavelength or within a particular wavelength band but substantially unresponsive to radiation at other wavelengths.

It is not of course necessary for the selected absorption band to be a narrow wavelength band. The coating 16 could be selected so as to have a narrow transmission band instead. It would therefore respond to radiation having wavelengths other than those in the narrow band but would be unresponsive to those within the narrow transmission band.

It would also be possible to use a material for the coating 16 which absorbed radiation lying within two different wavelength bands but which transmitted radiation at other wavelengths. Therefore, such an arrangement would produce an electrical output dependent on the radiation lying in the two selected bands but would be unresponsive to other radiation. Conversely of course, the coating 16 could be arranged to transmit radiation lying within each of two narrow wavelength bands and to absorb radiation at other wavelengths, thereby rendering it unresponsive to radiation lying within the wavelength bands but responsive to other radiation.

The use of selectively absorbing material for the coating 16 therefore produces a detecting arrangement which can be rendered responsive to radiation lying within one or more wavelength bands without the need for radiation filters which are relatively expensive and increase the size of radiation detectors.

The material used for the coating 16 depends of course on the absorption/transmission characteristics which it is required to have. Organic polymers with isocyanate groups may be suitable as may polytetrafluorethylene (PTFE). Such materials have radiation absorption bands at 4.3 micrometers, this being a wavelength band in which burning hydrocarbons emit most of their radiation. A detector arrangement using a material with such an absorption band as the coating material will thus respond to radiation from burning hydrocarbons, and can therefore be used as a fire detector, but will be relatively unresponsive to other radiation such as radiation from interfering sources. Suitable materials may be incorporated into the coating to enhance absorption at particular desired wavelengths. For example, sodium borohydride or cyanamide may be incorporated into paraffin wax to produce a coating having an absorption band at about 4.4 micrometers which is thus suitable for detecting radiation from burning hydrocarbons.

Another suitable coating for use in detecting radiation from burning hydrocarbons is a deuterated organic material, that is, such a material in which deuterium has been substituted for the hydrogen atoms. Such substitution moves the absorption band normally occurring at about 3.5 micrometers to about 4.3 to 4.4 micrometers. Examples of suitable materials are paraffin wax, varnish, polystyrene or other polymers in which this substitution can be made. Deutero-benzene (benzene in which deuterium has been substituted for the hydrogen) also has an absorption band at about 4.4 micrometers. This may be disolved in a suitable carrier such as paraffin wax to produce a coating satisfactory for detecting radiation from burning hydrocarbons.

Absorption at a particular wavelength may be enhanced by suitably adjusting the thickness of the coating 16. In general, increasing the thickness of the coating 16 will increase the amount of heat absorbed and thus increase the electrical output. However, the response of the detector arrangement ma be delayed.

It is important that the material of the coating 16 should adhere firmly to the conductive layer 8 and be in good thermal contact with it. It is necessary to achieve an adequately adhesive layer without disrupting the molecular structure which produces the desired absorption characteristic.

Figure 2:
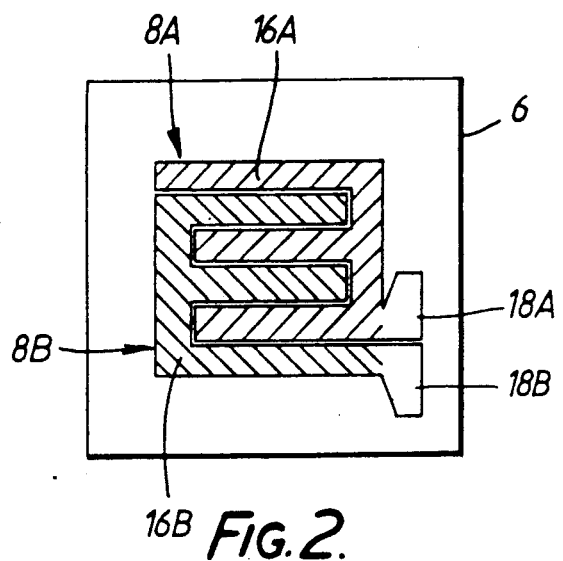
FIGS. 2 and 3 are front and rear views, respectively, of another one of the detectors.
Figure 3:
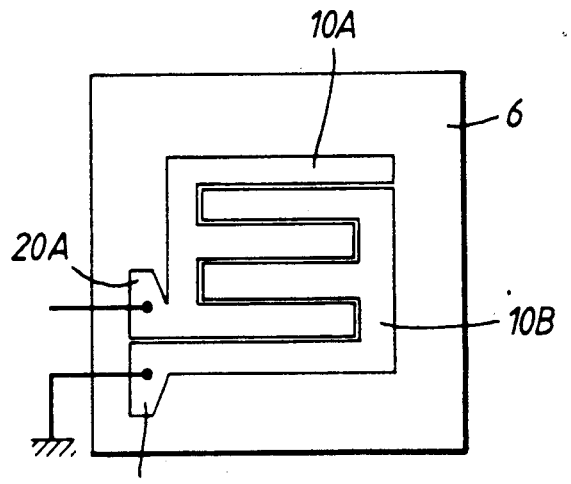

FIGS. 2 and 3 show front and rear views, respectively, of a modified form of the detector arrangement of FIG. 1. As shown in FIG. 3, a layer 6 of pyroelectric material has two separate electrode layers 10A and 10B on its rear surface, these layers having interdigitated extensions and respectively terminating in contact pads 20A and 20B.

The front surface of the pyroelectric material 6 (FIG. 2) has electrodes 8A and 8B matching and aligned with the electrodes 10A and 10B on the rear surface. The electrodes 8A and 8B are covered with respective selectively absorbing coatings 16A and 16B similar to the coating 16 of FIG. 1 and are not, of course, actually visible in FIG. 2. Contact pads 18A and 18B are respectively connected to the electrodes 8A and 8B.

In the arrangement of FIGS. 2 and 3, the coatings 16A and 16B are arranged to have different predetermined wavelength absorption bands. Radiation within the absorption band of the coating 16A will thus produce an electrical output between contact pads 18A and 20A, while radiation within the absorption band of coating 16B will produce an electrical output between contact pads 18B and 20B. In this way, a detector arrangement is produced capable of responding to radiation lying within two distinct predetermined wavelength bands, and without the need for any filtering arrangement. It is not of course necessary for the two wavelength bands both to be narrow: for example, one could be broad and could include the other. An advantage of such an arrangement is that it can be used with a single broadband optical system for directing the radiation onto the sensor. Sensors which use filters to make them respond only to radiation lying in separate predetermined wavebands may need duplicated optical systems because the filters may have a mutually exclusive optical action.

Other shapes for the electrode/absorbing coating can be used.

Pyroelectric materials will also produce electrical outputs due to the piezoelectric effect caused by shock or vibration. This, of course, is undesirable. A modified form of the arrangement shown in FIGS. 2 and 3 can be used to overcome this.

In this modification, one of the electrodes on the top surface, electrode 8B for example, is not provided with a coating at all and thus reflects all incident radiation. Substantially no heating will take place over the area of electrode 8B and there will therefore be no pyroelectric output between contacts pads 18B and 20B. However, there will continue to be a pyroelectric output between contacts pads 18A and 20A (in response to radiation within the predetermined absorption band(s) of coating 16A).

Electrical outputs due to the piezoelectric effect and following any shock or vibration to the device will be produced between both pairs of electrodes. Therefore, if contact pads 18A and 18B are connected electrically together, an electrical output will be produced between contact pads 20A and 20B corresponding only to the pyroelectric effect; the electrical potentials developed by the piezoelectric effect will cancel each other.

If it is desired to produce an electrical output in dependence on received radiation over the whole of a broad radiation band with the exception of one or more specifically defined narrow bands, this can be achieved by interconnecting the contact pads 18A and 18B, making the coating 16A to be absorbing over the broad band, and applying a coating 16B which is selected to be absorbing within the narrow wavelength band or bands. Therefore, any output produced pyroelectrically by any radiation within these narrow wavelength bands will be subtracted from the electrical output similarly produced between electrodes 8A and 10A.

Figure 6:
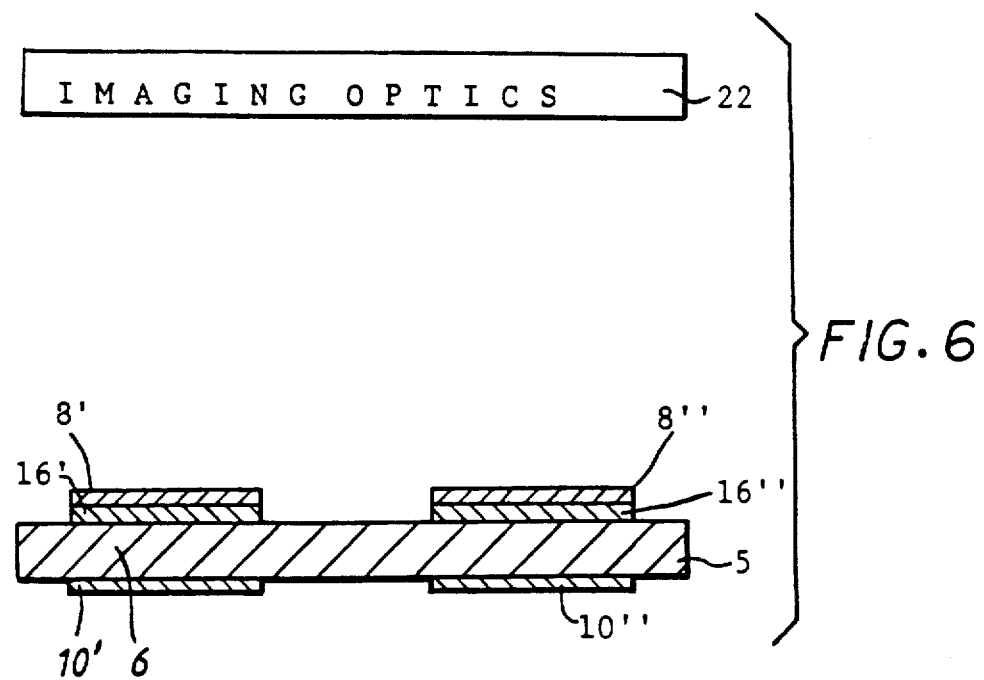
FIG. 6 is a cross-section through a further modified form of one of the detectors.

Detectors of the type described can be used to form imaging arrays. Thus, in one example shown in FIG. 6, a substrate of pyroelectric material 6 could be arranged with several discrete electrode areas deposited on its front surface at spaced positions, each such electrode area being of the form described in relation to. FIG. 1 and with matching and aligned electrodes, e.g., 10' and 10'', on the rear surface. Each such electrode on the front surface would be covered with a coating 16' and 16" corresponding to the coating 16 and which would be arranged to absorb radiation in a predetermined wavelength band. The predetermined wavelength bands could be the same for all the electrode areas, or different. The resultant sensor would then be used with imaging optics 22 for imaging the incident radiation from predetermined zones of an area being monitored onto respective ones of the electrode areas. In a modification, each electrode area would not comprise a single electrode but could be of the general form shown in FIGS. 2 and 3 — that is, each in the form of two mutually interdigitated electrode areas corresponding to the electrodes 8A and 8B (with matching and aligned electrodes 10A and 10B on the rear surface). Again, the resultant sensor would be used with imaging optics for imaging the incident radiation from predetermined zones onto the respective electrode areas but now each of the electrode areas could be made sensitive to radiation in two predetermined wavelength bands (or in one band only but with the piezoelectric compensation referred to above).

Arrangements such as described for forming imaging arrays could be arranged in two different ways. Thus, the discrete electrode areas could be deposited on the substrate in a regular pattern. In order to match the resultant sensor to the images produced (by the optics) from the zones of the particular area being monitored, appropriate ones of the electrode areas would be electrically connected together so as to form the required shapes to match the images. Alternatively, if the shapes of the imaged zones are known in advance, the electrode areas could be deposited so as to have the required shapes.

Such arrangements can be used to protect a number of adjacent zones in an area to be monitored so that an appropriate and selective response can be made. Thus, for example, the temperature in a number of adjacent zones could be monitored so as to produce warning signals when the temperature in any particular zone became excessive and a fire extinguisher could be actuated in response to any particular zone where flame was detected.

In a more specific example of such an arrangement, where there are two separated pairs of electrodes as shown in FIGS. 2 and 3, selective monitoring of an area within which fires or overheat are to be detected can be obtained. Thus, if there are two zones within the area each of which zones has a different maximum allowable temperature, radiation from the two zones can be focused onto respective parts of the front surface of the detector, these respective parts corresponding to separate electrodes corresponding to the electrodes 8A and 8B. Each such electrode would be covered with a different selectively absorbing coating. Matchingly shaped electrodes would be provided on the back surface of the detector. The selectively absorbing coatings would be appropriately selected to give the required response. Thus, they could be arranged to be selectively absorbing at different wavelength bands corresponding to the different maximum temperatures so as each to produce an electrical output when the temperature in the respective zone had exceeded the respective allowable maximum value. Instead, or in addition, one selectively absorbing coating could be made thicker than the other so as to produce a slower response.

In the modification of such an arrangement, radiation from the whole of the area could be focussed onto both electrodes on the top surface. One such electrode would have a selectively absorbing coating on it arranged to be responsive to radiation in a narrow wavelength band corresponding to fire (for example, a wavelength band centred at 4.3 micrometers corresponding to a hydrocarbon fire), while the coating on the other electrode could be arranged to absorb radiation over a band corresponding to overheat. Such an arrangement would therefore independently detect fire and overheat conditions in the same area.

Arrangements such as described can also be used in gas detection. Thus, using an arrangement of the form shown in FIG. 1, the coating 16 would be selected so as to absorb radiation in a narrow band corresponding to the absorption band of the gas to be detected. In the absence of the gas to be detected, the detector arrangement would produce an electrical output in response to the radiation falling on it and lying within the predetermined wavelength band, this radiation coming from a suitably positioned source (or possibly from background or other pre-existing radiation). In the presence of the gas to be detected, however, the radiation within the narrow wavelength band will be cut off (by being absorbed by the gas) and the correspondingly changed output of the arrangement indicates the presence of the gas. In the manner generally as described with reference to FIGS. 2 and 3, one or more other electrodes could also be placed on the top surface of the detector (with matchingly shaped electrodes on the undersurface) and coated with a coating corresponding to the coating 16 but arranged to absorb radiation unselectively. The electrical output so produced, in response to the incident radiation, could be backed off against the electrical output produced by the gas-detecting pair of electrodes and the arrangement would thus compensate for drift in the radiation output of the radiation source.

A suitable coating for detecting hydrocarbon gases would be paraffin wax which has a principal absorption band at about 3.5 micrometers corresponding to the principal absorption band of hydrocarbon gases.

Figure 4:
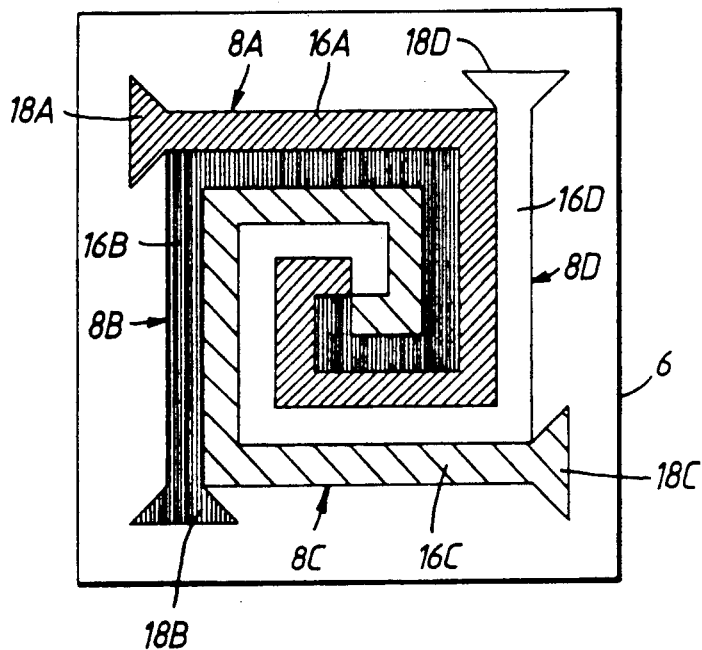
FIG. 4 is a front view of a further one of the detectors.

It would also be possible, using an arrangement such as illustrated in FIGS. 2 and 3, to detect two species of gas simultaneously. FIG. 4 shows such an arrangement which also incorporates compensation for variations in source and background radiation and for piezoelectric noise. FIG. 4 is a front view of the arrangement. As shown, a layer 6 of pyroelectric material has four separate electrode layers 8A, 8B, 8C and 8D. The electrodes are covered with respective coatings 16A, 16B, 16C and 16D and are therefore not actually visible in FIG. 4. Each electrode has a respective contact pad 18A, 18B, 18C and 18D. The rear surface (not shown) of the pyroelectric material 6 has electrodes which are respectively matching in shape and aligned with the electrodes on the front surface and which also have respective contact pads.

Coating 16A in the gas detector of FIG. 4 is selected so as to absorb radiation in a narrow band corresponding to the absorption band of one of the two gases to be detected, while coating 16B is selected so as to absorb radiation in a narrow band corresponding to the absorption band of the second gas to be detected. In the manner already described, in the absence of either of the gases to be detected a first electrical output will be produced between electrode 8A and the corresponding electrode on the rear surface and a second electrical output will be produced between electrode 8B and the corresponding electrode on the rear surface. These electrical outputs will be produced by the received radiation coming from a suitably positioned source (or possibly from background or other pre-existing radiation). In the presence of one of the gases to be detected, however, the radiation within the respective narrow wavelength band will be cut off (by being absorbed by the gas), and there will be a corresponding change in the respective electrical output, thus indicating detection of that particular gas.

The coating 16C is arranged to absorb radiation over a broad wavelength band corresponding to the general band within which the source of radiation emits. The purpose of this is to provide compensation for variations in the radiation emitted by the source (for example, due to drift) and other effects which cause a general variation in the radiation falling on the detector. Any such variations will cause a variation in the electrical output produced between electrode 8C and the corresponding electrode on the rear surface of the material 6, and this variation can be used to offset the resultant variation which would be caused in the outputs produced via electrodes 8A and 8B and which might otherwise be misinterpreted as being caused by the presence of the gases to be detected.

Finally, coating 16D is made reflective so as to absorb substantially no radiation. There will thus be substantially no pyroelectric output between electrode 8D and the corresponding electrode on the rear surface. However, any shock or vibration caused to the detector will produce a piezoelectric output between this pair of electrodes and this can be used to compensate for the corresponding piezoelectric outputs which will be produced between the other three electrode pairs and which otherwise would produce erroneous readings.

Figure 5:
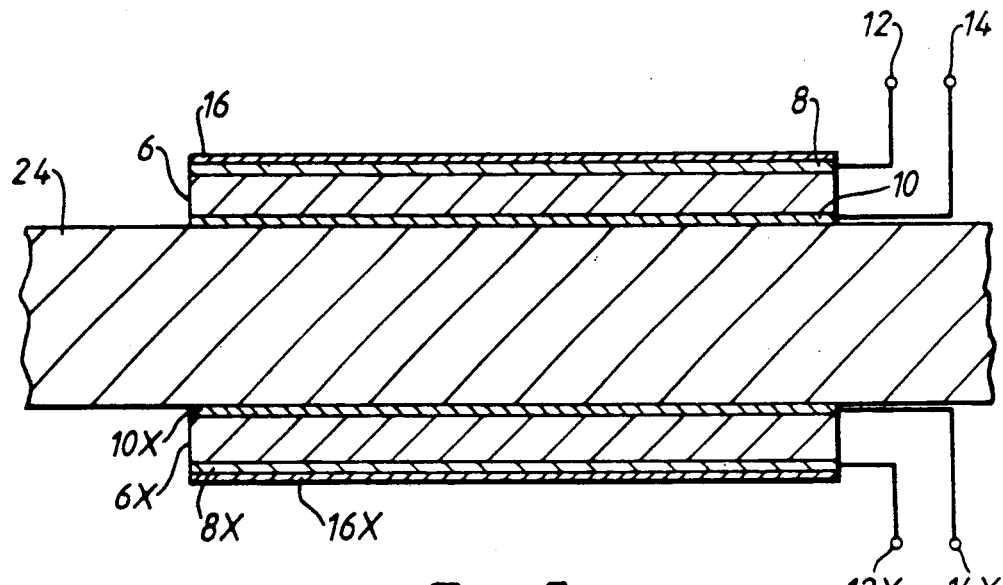
FIG. 5 is a cross-section through a modified form of one of the detectors.

FIG. 5 shows a modified arrangement which may be used, instead of the arrangement described above in relation to FIGS. 2 and 3 (and FIG. 4), for compensating for electrical outputs produced by the piezoelectric effect.

In FIG. 5, the layer of PVdF material 6 is shown as being mounted on a support 24, which could be any suitable support and may well be the circuit board bearing the associated electrical circuit elements as well. In the manner already explained, the layer 6 carries electrically conductive electrode surfaces 8 and 10 on its front and rear surfaces respectively, the front surface of electrode 8 being made reflective. The coating 16 is placed over the reflective surface of electrode 8 and, in the manner already described, has the specially selected radiation absorbing characteristics so as to produce an electrical output between electrodes 8 and 10, at terminals 12 and 14, when radiation lying in one or more predetermined wavebands is received in the direction of the arrow.

In order to compensate for the piezoelectric effect, a further layer 6X of PVdF is placed on the underside of the support 24 and carries electrodes 8X and 10X corresponding to electrodes 8 and 10. The exposed surface of electrode 8 carries a coating 16X which is at least physically similar to the coating 16.

Because the PVdF layer 6X is on the underside of the support 24, it will be shielded from incident radiation. Incident radiation causes only the PVdF layer 6 to produce an electrical output. However, both layers 6 and 6X of the PVdF will produce electrical outputs in response to the piezoelectric effect, and suitable electrical interconnection of the output from the electrodes 6 and 8, with that from electrodes 6X and 8X enables the piezo-electric output to be cancelled out. The electrodes 10 and 10X may in fact be conductive tracks or deposits on the support 24.

The arrangement shown in FIG. 5 has certain advantages as a means of cancelling piezo-electric outputs over the arrangements described for the same purpose in relation to FIGS. 2 and 3 and 4. In particular, piezoelectric noise cancellation is found to be improved because the acoustic environments on the two sides of the support 24 are substantially identical. The geometry of the PVdF layer 6X and its electrodes can be made to match those on the upper surface of the support more or less exactly. Furthermore, because the support 24 shields the underside layer of PVdF from radiation more or less completely, the exposed surface of electrode 8X can be coated with the same material 16X as electrode 8 (this is of course not possible with the arrangements described with reference to FIGS. 2 and 3 and 4); therefore, this improves still further the matching of the mechanical and acoustic characteristics above and below the support 24, providing further improved piezoelectric output cancellation.

The arrangements described are not limited to the detection of infra-red radiation but can detect other electromagnetic radiation such as visible or ultra-violet radiation. It is necessary in such applications to arrange for the selectively absorbing coating to be a coating which absorbs and is heated by the radiation to be detected. Using suitable coating materials, it is clearly possible to construct an arrangement responsive to visible radiation lying within a predetermined narrow wavelength band and thus to detect a particular colour.

It is not necessary for the layer 6 to be a pyroelectric layer. Instead, any other thermo-electrically responsive material may be used. For example, a thermopile arrangement may be used in which the electrode 8 of FIG. 1 corresponds to the hot junction and the electrode 10 to the cold junction. The arrangement would otherwise operate in the manner already described, with the coating 16 being chosen to have the desired selectively absorbing characteristics and with the material at the hot junction being arranged to be reflective.

What is claimed is:

1. An infra-red radiation detection arrangement, comprising
   a thermoelectrically responsive substrate,
   an infra-red radiation-reflecting surface on the substrate,
   at least a first part of the infra-red radiation-reflecting surface of the substrate being covered by selective infra-red radiation absorbing material,
   the infra-red radiation absorbing capability of the said material varying with the wavelength of the incident infra-red radiation, such that the material has a substantially greater infra-red radiation absorbing capability at infra-red wavelengths in one predetermined narrow infra-red wavelength band than at infra-red wavelengths outside that band, so that incident infra-red radiation in the said one wavelength band is absorbed and causes heating of the substrate but infra-red radiation at the wavelengths outside this band is substantially unabsorbed and is reflected by the reflecting surface and causes substantially no heating.

2. An arrangement according to claim 1, in which a second part of the reflecting surface is covered by further selective infra-red radiation absorbing material, the infra-red radiation absorbing capability of the said further material varying with the infra-red wavelength of the incident infra-red radiation, such that the material has a substantially greater infra-red radiation absorbing capability at infra-red wavelengths in one predetermined narrow infra-red wavelength band than at infra-red wavelengths outside that band, so that incident infra-red radiation in that band is absorbed and causes heating of the substrate but infra-red radiation at the wavelengths outside that band is substantially unabsorbed and is reflected by the reflecting surface and causes substantially no heating, the said one predetermined narrow infra-red wavelength band for the said further material being different from the said one predetermined narrow infra-red wavelength band for the material covering the said first part of the reflecting surface.

3. An arrangement according to claim 2, in which the first part of the thermo-electrically responsive substrate produces a first electrical output corresponding to the heat applied to it by the infra-red radiation reaching it, and the second part of the thermo-electrically responsive substrate produces a second electrical output corresponding to the heat applied to it by the infra-red radiation reaching it.

4. An arrangement according to claim 3, including means electrically interconnecting the electrical outputs so as to produce a composite output dependent on their difference.

5. An arrangement according to claim 1, in which another part of the radiation-reflecting surface is not covered with the said material.

6. An arrangement according to claim 1, including
   support means,
   means mounting the thermoelectrically responsive substrate on a surface of the support means so as to be positioned thereby to be exposed to the said radiation,
   a further thermoelectrically responsive substrate mounted on another surface of the support means in such position as to be shielded thereby from the said radiation, and
   means electrically interconnecting the two thermoelectrically responsive substrates so that outputs produced piezo-electrically by them substantially cancel each other.

7. An arrangement according to claim 6, in which the said further thermoelectrically responsive substrate carries material corresponding at least mechanically to the material whose radiation absorbing capability has a predetermined variation and which is carried by the first-mentioned thermoelectrically responsive substrate, so that the mechanical characteristics of the two substrates are rendered at least approximately the same.

8. An arrangement according to claim 1, in which the thermoelectrically responsive substrate is pyroelectrically responsive means positioned between electrodes.

9. An arrangement according to claim 8, in which the reflecting surface is a reflecting surface of or on one of the said electrodes.

10. An arrangement according to claim 8, in which the pyroelectrically responsive means comprises a pyroelectric polymer material.

11. An arrangement according to claim 10, in which the pyroelectric polymer material is polyvinylidene fluoride.

12. An arrangement according to claim 1, in which the or each thermoelectrically responsive substrate is thermopile means.

13. An arrangement according to claim 1, in which the said material is a deuterated organic material.

14. An infra-red radiation detection arrangement, comprising
   a layer of pyroelectric material,
   a first pair of electrodes,
   at least part of the pyroelectric material being positioned between the electrodes of the first pair,
   one of the electrodes having an infra-red radiation-reflecting surface at least a first part of which is covered with infra-red radiation absorbing material having a greater infra-red radiation absorbing capability at infra-red wavelengths within one predetermined narrow infra-red wavelength band than at infra-red wavelengths outside that band,
   so that incident infra-red radiation in the said one infra-red wavelength band is absorbed and heats the adjacent pyroelectric material to produce a corresponding electrical output between the electrodes and incident infra-red radiation at infra-red wavelengths outside that band is substantially unabsorbed and is reflected by the reflecting surface and thereby produces substantially no heating.

15. An arrangement according to claim 14, including a second pair of electrodes, and in which another part of the pyroelectric layer is positioned between the second pair of electrodes one of which has an infra-red radiation-reflecting surface.

16. An arrangement according to claim 15, in which the infra-red radiation-reflecting surface of the said one electrode of the second pair of electrodes is covered with infra-red radiation absorbing material which has a greater infra-red radiation absorbing capability at infra-red wavelengths in one predetermined narrow infra-red wavelength band than at infra-red wavelengths outside that band, so that incident infra-red radiation within that wavelength band is absorbed and heats the adjacent pyroelectric material to produce a corresponding electrical output between the electrodes and incident infra-red radiation at infra-red wavelengths outside that band is substantially unabsorbed there and is reflected by the reflecting surface and thereby produces substantially no heating, the said one infra-red wavelength band of the infra-red radiation absorbing material covering the infra-red radiation reflecting surface of the said one electrode of the second pair of electrodes being distinct from the said one infra-red wavelength band of the infra-red radiation absorbing material covering the infra-red radiation reflecting surface of the said one electrode of the first pair of electrodes.

17. An arrangement according to claim 16, in which the infra-red radiation-reflecting surface of the second electrode of the second pair of electrodes is not covered with infra-red radiation absorbing material and the electrical output produced between the second pair of electrodes is connected in opposition to the electrical output produced between the first pair of electrodes such that any electrical outputs produced piezoelectrically in the said layer and produced respectively between the electrodes of the said two pairs substantially cancel each other.

18. An arrangement according to claim 15, in which the infra-red radiation-reflecting surface of the said one electrode of the second pair of electrodes is covered with infra-red radiation absorbing material whose infra-red radiation absorbing capability at infra-red wavelengths within the said one predetermined narrow infra-red wavelength band is substantially the same as its infra-red radiation absorbing capability at infra-red wavelengths outside that band such that infra-red radiation incident on this infra-red radiation absorbing material in the said one predetermined infra-red wavelength band and at infra-red wavelength outside that band is absorbed and heats the adjacent pyroelectric material to produce a corresponding electrical output, and including means responsive to variations in that electrical output to compensate for any corresponding variations in the first-mentioned electrical output.

19. An arrangement according to claim 14, in which the infra-red radiation absorbing material is a deuterated organic material.

20. An arrangement according to claim 14, in which a plurality of different parts of the layer of pyroelectric material are positioned between respective said pairs of electrodes, and including means for directing infra-red radiation from different predetermined zones of an area being monitored towards the respective said parts.

21. An arrangement according to claim 20, in which the infra-red radiation directing means directs infra-red radiation from a particular said zone towards a predetermined plurality of said parts of the pyroelectric material, and including means electrically connecting the electrodes between which those said parts are positioned.

22. An arrangement according to claim 14, including means responsive to the said electrical output to produce a warning of increased temperature.

23. An arrangement according to claim 14, in which the said one predetermined infra-red wavelength band corresponds to a predetermined infra-red wavelength band at which a gas to be detected absorbs infra-red radiation, whereby a reduction in the said electrical output indicates the presence of the gas.

24. An arrangement according to claim 17, in which the pyroelectric material is polyvinylidene fluoride.

25. An arrangement according to claim 14, in which the said one predetermined narrow infra-red wavelength band is one infra-red wavelength band of a plurality of narrow infra-red wavelength bands at all the wavelengths of which the said material has a substantial infra-red radiation absorbing capability, the material having insubstantial infra-red radiation absorbing capability at infra-red wavelengths outside the said narrow infra-red wavelength bands.

26. An arrangement according to claim 14, including support means,
    means mounting the said layer of pyroelectric material on the support means in such position as to be exposed to the incident infra-red radiation,
    further pyroelectric material carried by the said support means in such position as to be shielded thereby from the said incident infra-red radiation and positioned between a respective pair of electrodes, and
    means interconnecting the output from the latter pair of electrodes with the output produced by the first-mentioned pair of electrodes such that any electrical outputs produced piezoelectrically in the said layers substantially cancel each other.

27. An arrangement according to claim 26, in which the said further pyroelectric material carries infra-red radiation absorbing material of which at least the mechanical properties are substantially the same as those of the infra-red radiation absorbing material carried by the first-mentioned layer of pyroelectric material.

* * * * *

UNITED STATES PATENT AND TRADEMARK OFFICE
CERTIFICATE OF CORRECTION

PATENT NO. : 5,030,827
DATED : July 9, 1991
INVENTOR(S) : Brian D. Powell It is certified that error appears in the above-identified patent and that said Letters Patent is hereby corrected as shown below:

In the Drawings:
The sheet of Drawing consisting of Fig. 6, should be added as shown on the attached sheet.

Column 3, line 49, delete the word "ma" and substitute therefore -- may
Column 4, line 64, after the word "areas" insert --, e.g. 8' and 8''--.
Column 12, line 3, delete "17" and substitute therefore -- 14 --.

Signed and Sealed this

Eighth Day of June, 1993

Attest:

MICHAEL K. KIRK

*Attesting Officer*     *Acting Commissioner of Patents and Trademarks*

UNITED STATES PATENT AND TRADEMARK OFFICE
CERTIFICATE OF CORRECTION

PATENT NO. : 5,030,827

DATED : July 9, 1991

INVENTOR(S) : Brian D. Powell

It is certified that error appears in the above-identified patent and that said Letters Patent is hereby corrected as shown below:

Column 4, line 64, after the word "areas" insert --, e.g. 8' and 8' ' --.

Signed and Sealed this

First Day of November, 1994

Attest:

BRUCE LEHMAN

*Attesting Officer*  *Commissioner of Patents and Trademarks*